United States Patent [19]

Inoue et al.

[11] Patent Number: 5,432,494

[45] Date of Patent: Jul. 11, 1995

[54] MAGNETORESISTANCE ELEMENT

[75] Inventors: Keizou Inoue, Shiga; Masaaki Kanae, Nagaokakyo; Yoshifumi Ogiso, Kameoka; Takuji Nakagawa, Kyoto, all of Japan

[73] Assignee: Murata Manufacturing Co., Ltd., Kyoto, Japan

[21] Appl. No.: 67,232

[22] Filed: May 26, 1993

[30] Foreign Application Priority Data

May 27, 1992 [JP] Japan .................. 4-134883

[51] Int. Cl.⁶ ............................................ H01L 43/00
[52] U.S. Cl. ................................................ 338/32 R
[58] Field of Search ............ 338/32 R; 324/249, 252; 360/110, 113, 125; 330/62

[56] References Cited

U.S. PATENT DOCUMENTS

| | | | |
|---|---|---|---|
| 4,103,315 | 7/1978 | Hempstead et al. | 360/110 |
| 4,155,642 | 10/1992 | Voegeli | 360/113 |
| 4,301,418 | 11/1981 | Gordon et al. | 330/62 |
| 4,833,560 | 5/1989 | Doyle | 338/32 R X |
| 4,954,216 | 9/1990 | Hunter et al. | 324/252 X |

FOREIGN PATENT DOCUMENTS

| | | |
|---|---|---|
| 123126 | 10/1976 | Japan . |
| 138380 | 2/1978 | Japan . |
| 9612 | 1/1979 | Japan . |
| 16580 | 1/1983 | Japan . |

*Primary Examiner*—Marvin M. Lateef
*Attorney, Agent, or Firm*—Ostrolenk, Faber, Gerb & Soffen

[57] ABSTRACT

A magnetoresistance element includes an insulating substrate, a patterned magnetoresistance film of a ferromagnetic material deposited thereon and having a uniaxis magnetic anisotropy, and a patterned hard biasing layer of a ferromagnetic material deposited on the substrate. The biasing layer is divided into two parts on both sides of the magnetoresistance layer and magnetized in the direction parallel to a line which intersects the easy direction of magnetization of the patterned magnetoresistance layer at an acute angle ($\theta$).

7 Claims, 4 Drawing Sheets

(the axis of easy magnetization of the magnetoresistance elements)

MAGNETORESISTANCE ELEMENT

BACKGROUND OF THE INVENTION

1. Field of the Invention

The present invention relates to a magnetoresistance element and, more particularly, a magnetoresistance element for detection of a magnetic field, utilizing magneto-resistance, i.e., the change of electrical resistance produced in a ferromagnetic material on application of a magnetic field H, that depends on an angle between the direction of magnetization and the direction of current flow.

2. Description of the Background Art

Magnetoresistance elements comprise a thin magneto-resistance strip or film of a ferromagnetic material, usually of a Ni—Fe alloy or Ni—Co alloy, deposited on an insulating substrate and connected to terminals at both ends thereof. The elements are covered with a protective coating as occasion demands. Also, in order to compensate or give a uniaxis magnetic anisotropy to the element, some magnetoresistance elements have a hard biasing layer deposited on the strip and magnetized in the direction parallel to the easy direction of magnetization of the strip.

If it is required to shift the operating point of the magnetoresistance element without changing the direction of easy magnetization, it is usual to apply a magnetic field to the element from a permanent magnet or an electromagnet created by an electric current. Instead of the external magnetic field, it is occasionally carried out to partially magnetize the magnetoresistance strip in a desired direction. However, such magnetoresistance elements are complex in structure and troublesome in production.

SUMMARY OF THE INVENTION

It is therefore an object of the present invention to provide a magnetoresistance element that is simple in structure, and makes it possible to shift the operating point without causing change in the direction of easy magnetization thereof.

The above and other objects of the present invention are achieved by providing a magnetoresistance element comprising an insulating substrate, a patterned magnetoresistance film of a ferromagnetic material deposited on the substrate and having a uniaxis magnetic anisotropy, and a patterned hard biasing layer of a ferromagnetic material deposited on the substrate, the biasing layer being divided into a plurality of segments located on both sides of the patterned magnetoresistance layer, each of the segments being magnetized parallel to a line which intersects the easy direction of magnetization of the patterned magnetoresistance layer at an acute angle ($\theta$).

As the substrate, there may be used any well-known insulating materials, such as heat-resistant glasses, alumina, zirconia, other ceramics, and the like.

BRIEF DESCRIPTION OF THE DRAWINGS

These and other objects and features of the present invention will become clear from the following description, taken in conjunction with the preferred embodiments thereof, with reference to the accompanying drawings throughout in which like parts are designated by like reference numerals, and in which.

DETAILED DESCRIPTION OF THE PREFERRED EMBODIMENTS

Figure 1:
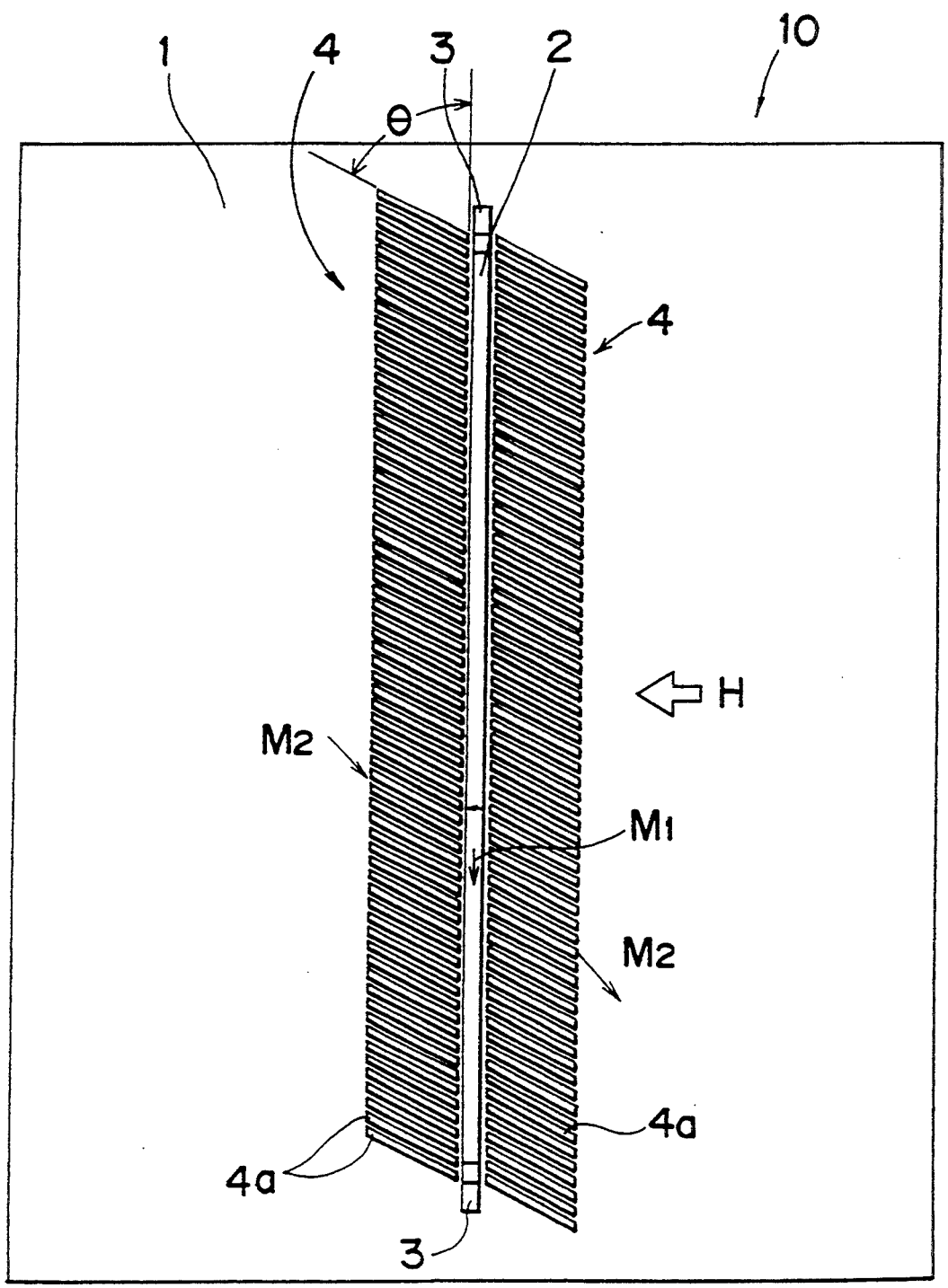
FIG. 1 is a plane view of a magnetoresistance element embodying the present invention.

Referring now to FIG. 1, there is shown a magnetoresistance element, generally indicated by numeral 10, of the present invention. The magnetoresistance element 10 comprises an insulating substrate 1 of a heat-resistant glass, a patterned magnetoresistance layer 2 serving as a magnetosensitive part, a pair of terminals 3 connected to both ends of the patterned magnetoresistance layer 2, and a patterned hard biasing layer 4 of a ferromagnetic material.

The patterned magnetoresistance layer 2 is composed of a thin ferromagnetic film of a Ni—Co alloy on the substrate 1 in the form of a strip. The biasing layer 4 is composed of ferromagnetic thin films of a Ti and Co—Ni alloy on the substrate 1 and divided into two parts located on both sides of the patterned magnetoresistance layer 2. Each biasing part includes a plurality of segments or strip lines 4a magnetized parallel to a line which intersects the easy direction of magnetization of the patterned magnetoresistance layer 2 at an acute angle ($\theta$). Thus, the strip lines 4a are inclined at an angle ($\theta$) to the easy direction of magnetization of the patterned magnetoresistance layer 2.

The above magnetoresistance element may be produced, for example, in the following manner:

Firstly, a Ni-25% Co alloy is deposited over the entire surface of an insulating glass substrate 1 in a magnetic field to create a ferromagnetic thin film with a thickness of 50 nm. This ferromagnetic film is then photolithographed to form a patterned magnetoresistance layer, i.e., magnetoresistance strip-line 2 (20 $\mu$m in width and 1 mm in length) having the easy direction of magnetization parallel to the longitudinal direction thereof.

Then, titanium is evaporated over the entire surface of the substrate 1 to create a titanium layer (50 nm in thickness) serving as an undercoat for electrodes, and then a Co-15% Ni alloy is deposited on the titanium layer to create a ferromagnetic layer (300 nm in thickness). The photolithographic techniques are once again used to form a pattern of terminals 3 and hard biasing parts 4, as shown in FIG. 1. Each terminal 3 makes a contact to one end of the magnetoresistance strip-line 2 serving as a magneto-sensitive part, while the biasing parts 4 are located on both sides of the magnetoresistance strip-line 2 at a distance of 4 $\mu$m from the side of the magnetoresistance strip-line 2. Each biasing part 4 is divided into a plurality of parallel strip-lines 4a (10 $\mu$m in width and 15 $\mu$m in length), which are inclined at an angle ($\theta$) of 60° to the longitudinal direction of magnetization of the magnetoresistance strip-line 2, as illustrated in FIG. 1.

The terminals 3 and the strip-lines 5 of the biasing parts 4 are magnetized by heat-treatment in a magnetic field applied to the substrate in the direction equal to the easy direction of magnetization of the magnetoresistance strip-line 2. In this case, the strip-lines 4a are magnetized toward the longitudinal direction thereof, as indicated by an arrow $M_2$, since the strip-lines 4a are inclined to the direction of magnetic field applied. Since the magnetic field produced by the biasing parts 4 has a magnetic component perpendicular to the easy direction of magnetization of the magnetoresistance strip-line 2, a biasing magnetic field is applied to the magnetoresistance strip-line 2 by the strip-lines 4a of the biasing parts 4. In FIG. 1, an arrow $M_1$ indicates the direction of magnetization for the magnetoresistance strip-line 2.

Figure 2:
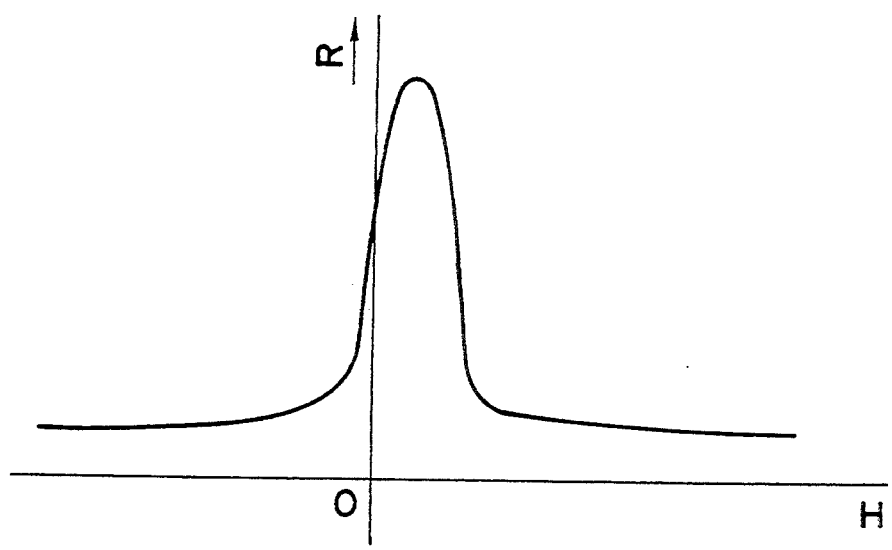
FIGS. 2 and 3 are graphs showing changes of resistance of the element of FIG. 1 as a function of a magnetic field of signals applied thereto.
Figure 3:
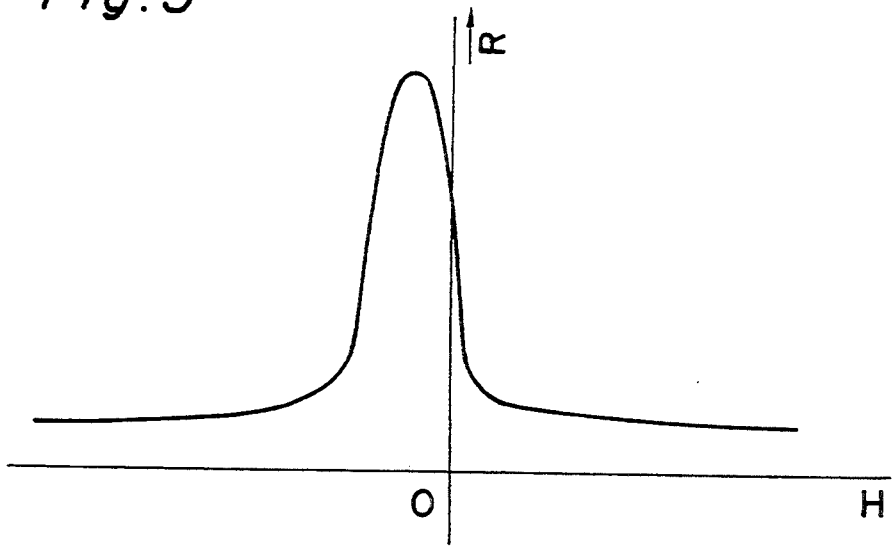

FIGS. 2 and 3 show a characteristic curve for the magnetoresistance element shown in FIG. 1, illustrating the change of resistance as a function of a magnetic field of signals applied.

If the magnetic field H of signals is directed toward the left side in FIG. 1, the resistance of the element 10 varies with the magnetic field H, as shown in FIG. 2. In the area where the magnetic field H takes a positive value close to zero and above, the resistance of the element increases with the increase of the magnetic field H, and becomes maximum at the point where a combined magnetic field of the magnetic field due to the biasing part 4, and the magnetic field H due to signals, is directed toward the longitudinal (current flow) direction of a patterned magnetoresistance layer 2. The resistance of the element decreases when the magnetic field H due to signals takes a value of the negative sign.

In contrast therewith, if the magnetic field H is directed toward the right side in FIG. 1, the resistance of the element varies with the magnetic field H of signals, as illustrated in FIG. 3. In the area where the magnetic field H takes a value around zero, the resistance of the element decreases with the increase of the magnetic field H, but increases with decrease of the magnetic field H.

As will be understood from the results shown in FIGS. 2 and 3, the operating point of the magnetoresistance element of FIG. 1 can be shifted by provision of the hard biasing parts and by changing the direction of magnetic signals applied to the element.

In the embodiment of FIG. 1, the strip-lines 4a of the biasing parts 4 may be magnetized by applying a magnetic field to the strip-lines in the longitudinal direction thereof. In this case, the magnetic characteristic of the magnetoresistance strip-line 2 may be varied with values of the magnetic field applied, resulting in poor accuracy due to hysteresis.

In the above embodiment, the magnetization of the strip-lines 4a is carried out by the heat-treatment in the magnetic field, but it may be done simultaneously with the film deposition by carrying out the vapor deposition of the ferromagnetic layer in the magnetic field.

Figure 4:
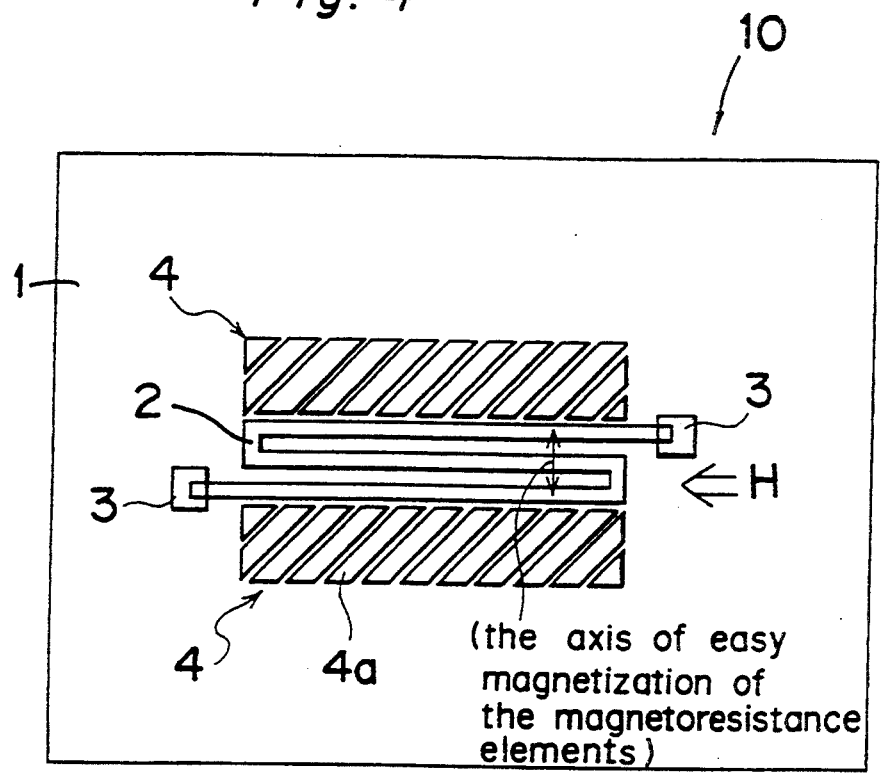
FIG. 4 is a plane view of a magnetoresistance element showing another embodiment of the present invention.

Referring now to FIG. 4, there is shown a plane view illustrating a structure of a magnetoresistance element of another embodiment of the present invention. The magnetoresistance element 10 comprises an insulating substrate 1 of grazed alumina, a patterned magnetoresistance layer 2 serving as a magnetosensitive part, a pair of terminals 3 connected to both ends of the patterned magnetoresistance layer 2, and two hard biasing parts 4.

The patterned magnetoresistance layer 2 includes a ferromagnetic strip or thin film of a Ni-18% Fe alloy deposited on the substrate 1. The biasing parts 4 are arranged on both sides of the patterned magnetoresistance layer 2 and composed of a plurality of parallel strips 4a of a Co-18% Ni alloy in the form of a parallelogram. The strips 4a are inclined at an angle ($\theta$) of 45° to the easy direction of magnetization of the patterned magnetoresistance layer 2. Such magnetoresistance element 10 may be produced, for example, in the following manner:

Firstly, a ferromagnetic film with a thickness of 30 nm is deposited on the grazed surface of the substrate 1 by vapor deposition of a Ni-18% Fe alloy in a magnetic field, and then etched by photolithography to form a magnetoresistance strip-line 2 (50 $\mu$m in each width and 500 $\mu$m in length) so that the easy direction of magnetization is directed toward transverse direction.

Then, a Co-18% Ni alloy is deposited on the substrate to create a hard biasing layer with a thickness of 200 nm, and subjected to the photolithography to form a pattern of terminals 3 and hard biasing parts 4, as shown in FIG. 4.

Each terminal 3 makes a contact to one end of the strip of the magnetoresistance strip-line 2, while the biasing parts 4 are located on both sides of the magnetoresistance strip-line 2 at an interval of 5 $\mu$m therefrom. Each biasing part 4 is composed of a plurality of strip-lines 4a (45 $\mu$m in width and 100 $\mu$m in length) which are arranged at intervals of 50 $\mu$m from each other along the entire length of the magnetoresistance strip-line 2 and inclined at an angle of 45° to the side of the magnetoresistance strip-line 2.

Then, the terminals 3 and the strip-lines 4a are magnetized by heat-treatment in the magnetic field applied in the direction parallel to the easy direction of magnetization of the magnetoresistance strip-line 2. In this case, the strip-lines 4a are magnetized in the longitudinal direction thereof since the strip-lines 4a are inclined to the direction of magnetic field applied. Thus, a biasing magnetic field is applied to the magnetoresistance strip-line 2 by the strip-lines 4a of the biasing parts 4 since the magnetic field produced by the biasing parts 4 has a component perpendicular to the easy direction of magnetization of the magnetoresistance strip-line 2.

Figure 5:
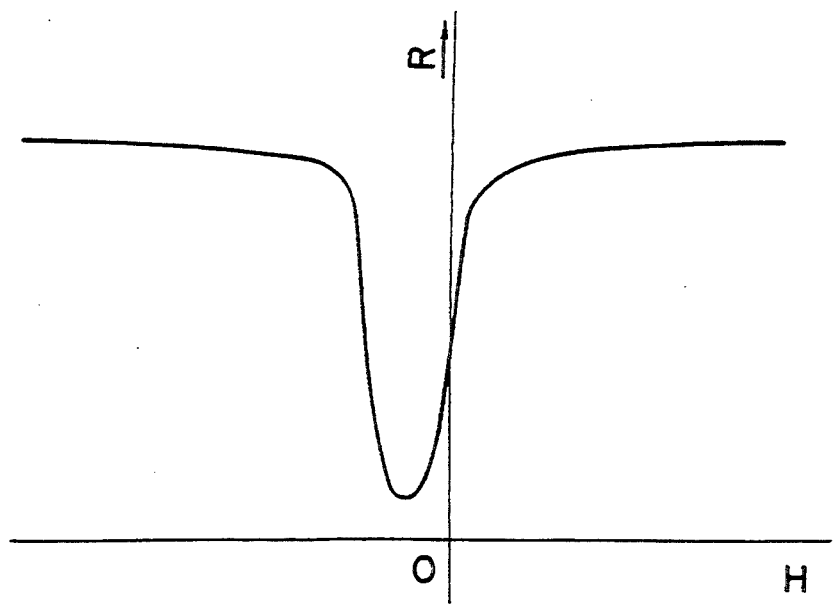
FIG. 5 is a graph showing the change of resistance of the element of FIG. 4 with a magnetic field of signals applied thereto.

If the magnetoresistance element of FIG. 4 is operated under such conditions that the magnetoresistance strip-line 2 and the biasing strips 5 are being magnetized in the left direction and that a magnetic field of signals is applied to the element in the direction perpendicular to the easy direction of magnetization (i.e., in the direction of the transverse (short side) axis of the patterned magnetoresistance layer 2), the resistance of the element 10 varies with the magnetic field of signals applied, as shown in FIG. 5.

In the case where the magnetoresistance element 10 has no hard biasing part 4, the resistance of the element operated under the same conditions as above becomes minimum when the magnetic field of signals is 0.

From the above, it is clear that the operating point of the magnetoresistance element can be shifted by provision of the biasing parts 4 on both sides of the magnetoresistance strip-line 2. Also, the operating point of the magnetoresistance element can be shifted by changing the direction of the magnetic field of signals applied to the element.

Figure 6:
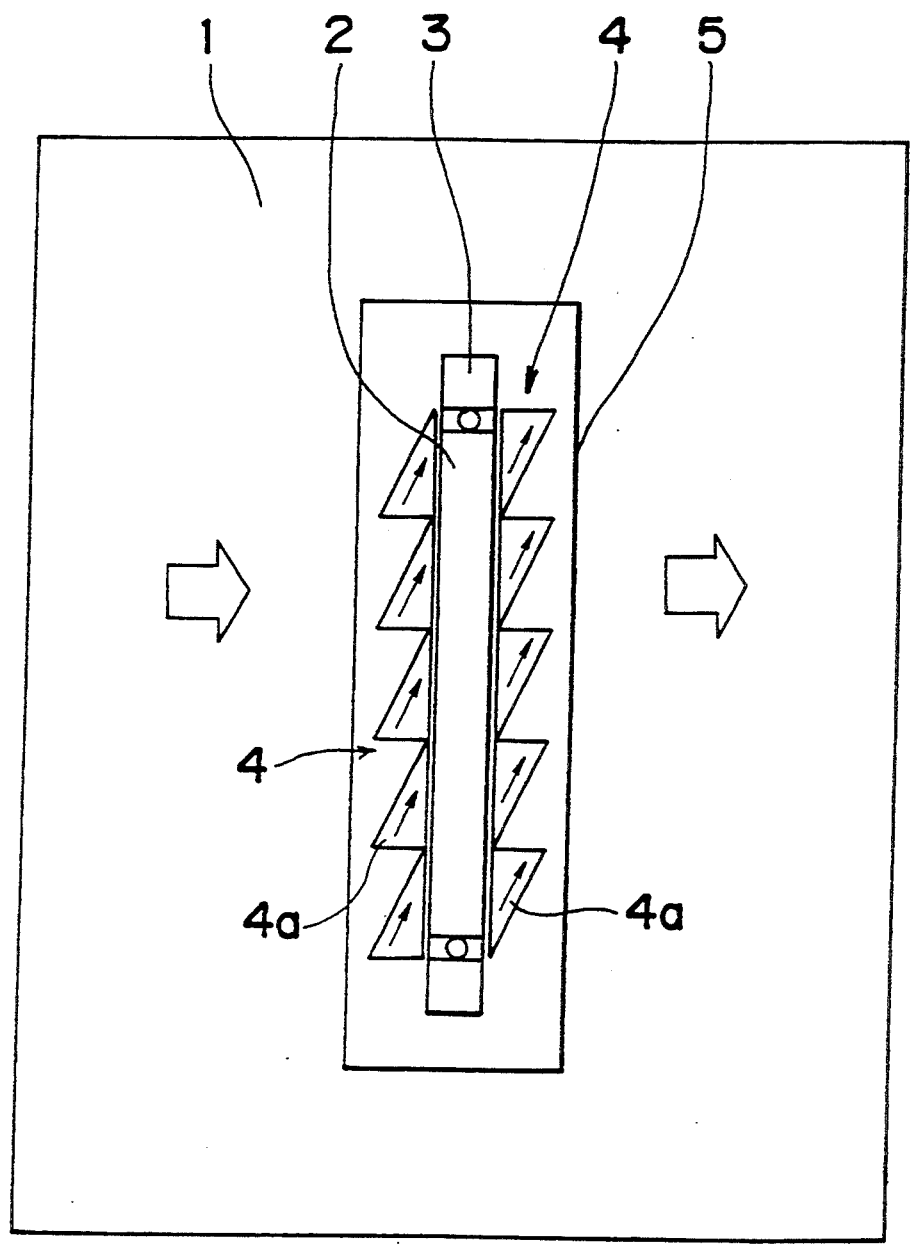
FIG. 6 is a plane view of a magnetoresistance element showing still another embodiment of the present invention.

Referring now to FIG. 6, there is shown another embodiment of the present invention. In this embodiment, the magnetoresistance element 10 comprises an insulating glass substrate 1, a magnetoresistance strip-line 2 composed of a ferromagnetic strip or thin film of a Ni-18% Fe alloy, a pair of terminals 3 connected to both ends of the magnetoresistance strip-line 2, hard biasing parts 4 composed of a Co-18% Ni alloy layer and Au layer deposited thereon, and a protective coating 6 provided on the magnetoresistance strip-line 2.

The above magnetoresistance element 10 may be produced, for example, in the following manner. Firstly, a Ni-18% Fe alloy is deposited on a glass substrate 1 to form a ferromagnetic film with a 30 nm thick, and the resultant film is photolithographed to produce a magnetoresistance strip-line 2 with a width of 50 μm and a length of 500 μm. Then, a Si—N compound is deposited on the entire surface of the strip-line 2 and a part of the substrate by vapor deposition to form a protective layer 5 while leaving small holes in the protective layer 5 above both ends of the strip-line 2, and then a Co-18% Ni alloy and gold (Au) are in turn deposited on the protective layer 5 by vapor deposition to form a layer of metallization composed of a Co-18% Ni layer with 200 nm and an Au layer with 100 nm.

The metallized layer is photolithographed to produce terminals 3 and hard biasing parts 4 including a plurality of right-angled triangular islands 4a of 100 μm (base) by 50 μm (height) by 50√5μm (oblique side). The islands 4a are arranged on both sides of the magnetoresistance strip-line 2 in a row so that the base of each island 4a is directed toward the side of the ferromagnetic strip-line 2 and located at a distance of 5 μm from the side of the ferromagnetic strip-line 2. Each terminal 3 makes a contact to one end of the magnetosensitive part 2 through the small hole.

Then, the terminals 3 and the islands 4a are magnetized by heat-treatment while applying a magnetic field H to them in the direction parallel to the easy direction of magnetization of the magnetoresistance strip-line 2. In this case, each island 4a of the biasing parts are magnetized in the direction which makes an angle of 30° to the easy direction of magnetization of the magnetoresistance strip-line 2, as illustrated in FIG. 6, because of a shape magnetic anisotropy.

The magnetoresistance element of FIG. 6 provides the effects similar to those described with respect to the embodiments of the present invention shown in FIG. 1 and FIG. 4.

Although the present invention has been fully described in relation to particular embodiments thereof with reference to the accompanying drawings, it is to be noted that various changes and modifications will become apparent to those skilled in the art. It is preferred, therefore, that the present invention be limited not by the specific disclosure herein, but only by the appended claims.

What is claimed is:

1. A magnetoresistance element comprising:
   an insulating substrate;
   a patterned magnetoresistance layer of a ferromagnetic material deposited on said substrate, said magnetoresistance layer having a uniaxis magnetic anisotropy and an easy direction of magnetization; and
   a patterned hard biasing layer of a ferromagnetic material deposited on said substrate and divided into two parts each located on a respective side of said patterned magnetoresistance layer, and said biasing layer being magnetized in a direction parallel to a line which intersects the easy direction of magnetization of the patterned magnetoresistance layer at an acute angle ($\theta$).

2. The magnetoresistance element according to claim 1, wherein each part of said patterned hard biasing layer is divided into a plurality of strip-lines arranged side by side, each strip line being magnetized in the direction parallel to the line which intersects the easy direction of magnetization of said magnetoresistance layer at an acute angle ($\theta$).

3. The magnetoresistance element according to claim 1, wherein each part of said hard biasing layer is divided into a plurality of right-angle triangular islands arranged side by side.

4. The magnetoresistance element according to claim 1 wherein said magnetoresistance layer is patterned to form a strip having said easy axis of magnetization parallel to a longitudinal axis of said strip.

5. The magnetoresistance element according to claim 4 wherein said hard biasing layer is patterned to form two parts comprising a plurality of segments, said parts being located on respective sides of said magnetoresistance strip and spaced from said respective side of said magnetoresistance strip.

6. The magnetoresistance element according to claim 5 wherein each of said plurality of segments of said hard biasing layer are in a form of strip-lines, said strip-lines being arranged side by side so as to be inclined at an acute angle ($\theta$) to said easy axis of magnetization of said magnetoresistance strip.

7. The magnetoresistance element according to claim 5 wherein each of said plurality of segments of said hard biasing layer are in a form of right-angle triangular islands, said islands being arranged side by side and being arranged so that a base of each island is directed toward said respective side of said ferromagnetic strip and located at a certain distance from said side of said ferromagnetic strip and wherein said islands are magnetized in a direction which makes an acute angle ($\theta$) to said easy axis of magnetization of said magnetoresistance strip.

* * * * *